United States Patent [19]
You

[11] Patent Number: 5,193,733
[45] Date of Patent: Mar. 16, 1993

[54] CLAMPING DEVICE FOR INNER LEADS OF LEAD FRAME

[75] Inventor: Joong H. You, Choongchungbook, Rep. of Korea

[73] Assignee: Goldstar Electron Co., Ltd., Choongchungbook, Rep. of Korea

[21] Appl. No.: 795,451

[22] Filed: Nov. 21, 1991

[30] Foreign Application Priority Data

May 14, 1991 [KR] Rep. of Korea ................. 6846/1991

[51] Int. Cl.$^5$ .............................................. B23K 37/04
[52] U.S. Cl. ........................................ 228/4.5; 228/47
[58] Field of Search .................. 228/1.1, 4.5, 47, 110, 228/111, 179; 269/903

[56] References Cited

U.S. PATENT DOCUMENTS

4,958,762  9/1990  Shimizu et al. ........................ 228/1.1
4,979,663 12/1990  Sofia et al. .......................... 228/180.2
5,035,034  7/1991  Cotney ................................ 228/4.5

Primary Examiner—Samuel M. Heinrich
Attorney, Agent, or Firm—Lowe, Price, LeBlanc & Becker

[57] ABSTRACT

A clamp device for clamping inner leads of a lead frame includes a clamp fixing plate having a working opening and a plurality of inner lead clamps each made of a plate spring and fixedly mounted to an upper surface of the clamp fixing plate. Each of the inner lead clamps has at an inner end thereof a vertical pressing portion normal to the clamp fixing plate upper surface and extending downward into the working opening of the clamp fixing plate and is adapted to press a group of inner leads. The pressing portion of each inner lead clamp may have a plurality of uniformly spaced cut-out portions so that inner leads are clamped individually. A plurality of spaced bolt holes may be formed around the peripheral edges of the working opening. In this case, a compression coil spring is fitted around a bolt received in each bolt hole between the clamp fixing plate and each corresponding inner lead clamp. The springs urge the inner lead clamp away from the clamp fixing plate so that the inner lead clamps can clamp inner leads in groups or individually by virtue of the resilient force of compression coil springs.

5 Claims, 8 Drawing Sheets

CLAMPING DEVICE FOR INNER LEADS OF LEAD FRAME

FIELD OF THE INVENTION

The present invention relates to a clamping device for inner leads of a lead frame, and particularly to a clamping device adapted to closely contact inner leads of a lead frame to a heat block in wire bonding for manufacturing semi-conductor packages. More particularly, the present invention resides in a clamping device for inner leads of a lead frame which is capable of clamping inner leads serially or individually so as to more closely contact them to a heat block.

BACKGROUND OF THE PRIOR ART

In wire bonding for manufacturing semi-conductor packages, inner leads of a lead frame should closely contact a heat block so as to firmly maintain the electric connection between inner leads and a semiconductor chip and thus obtain a good yield of semi-conductor packages.

Conventionally, there have been proposed such clamping devices adapted to closely contact inner leads of a lead frame to a heat block. A typical example of conventional clamping devices is illustrated in FIG. 1.

Figure 1:
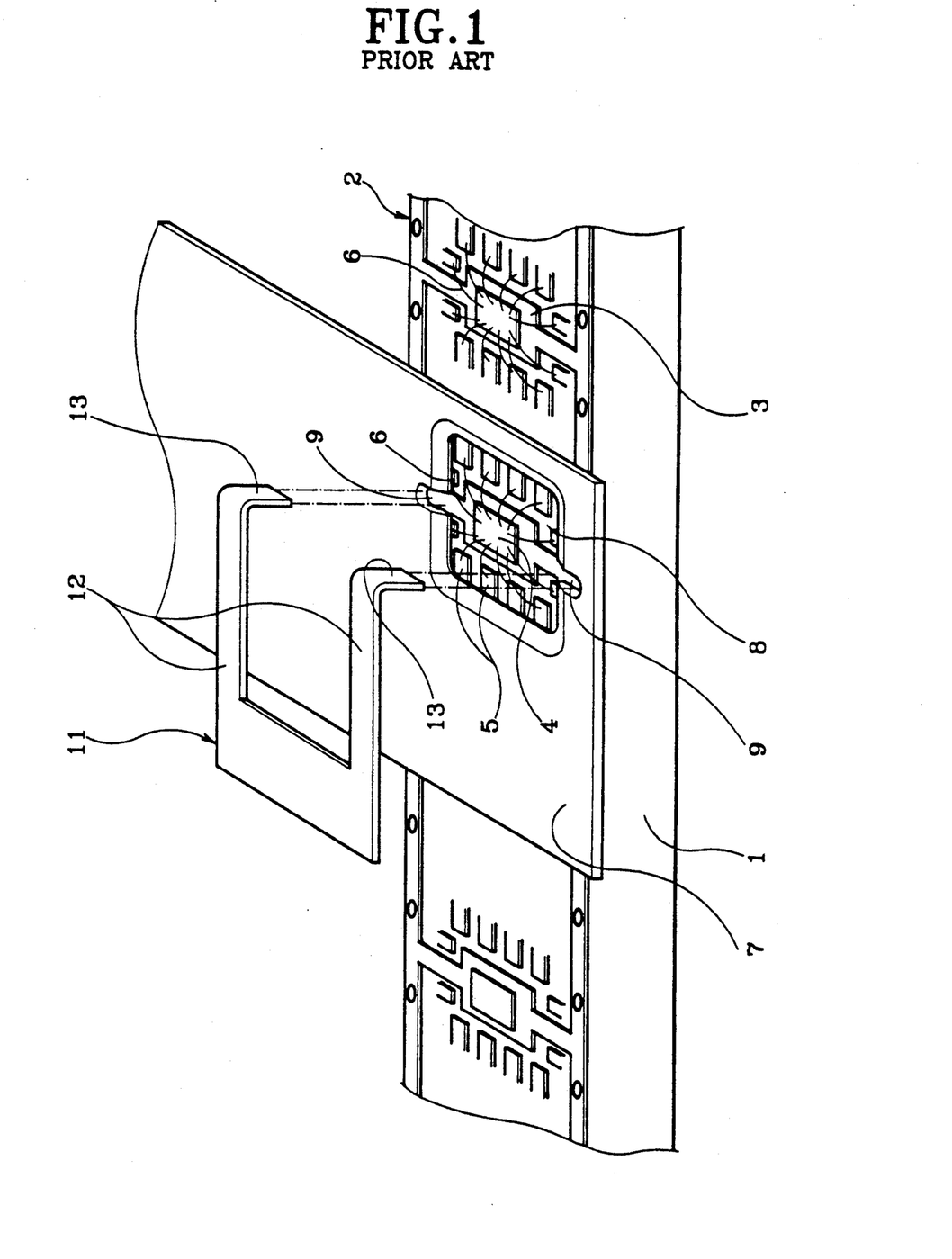
FIG. 1 is a perspective view of a conventional clamping device for inner leads of a lead frame.

FIG. 1 is a perspective view showing a known wire bonding process wherein a semi-conductor chip 4 which has been fixedly attached to a paddle 3 of a lead frame 2 supported on the upper surface of a heat block 1 are connected with inner leads 5 of the lead frame 2, by means of wires, particularly gold wires 6. In this case, the clamping device for inner leads comprises an inner lead clamp 7 and an auxiliary clamp 11 which cooperate with each other to press totally a plurality of inner leads 5 against a heat block 1.

Figure 2:
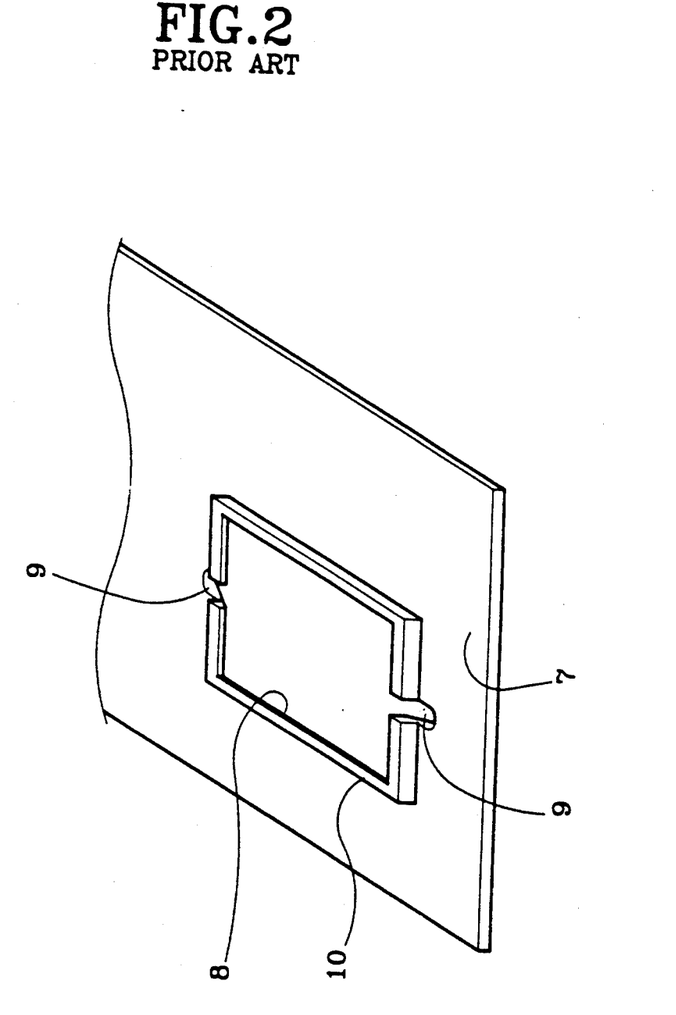
FIG. 2 is a perspective view showing the bottom construction of the clamping device shown in FIG. 1.

The inner lead frame 7 is of a plate shape having a certain thickness and has a generally rectangular working opening 8. A pair of support slots 9 are formed at respective middle portions of both short side edges of the working opening 8. On the lower surface of inner lead clamp 7, a pressing protrusion 10 having a rectangular rim with a certain thickness is formed around the peripheral edges of the working opening 8. On the other hand, the auxiliary clamp 11 comprises a pair of spaced horizontal portions 12 and a pair of curved vertical portions 13 extending downward from respective ends of the horizontal portions 12. The vertical portions 13 of auxiliary clamp 11 are fitted in the support slots 9 of inner lead clamp 7, respectively.

In wire bonding, the inner lead clamp 7 is positioned on the inner leads 5 of lead frame 2 which has been previously heated. Under the condition, the vertical portions 13 of auxiliary clamp 11 are fitted in both support slots 9 of inner lead clamp 7, respectively. Thereafter, the auxiliary clamp 11 is properly depressed by the worker's force so that inner leads 5 of the lead frame 2 are closely in contact with the heat block 1. Under the condition, respective inner leads 4 are connected with the semi-conductor chip 4, by means of wires 6.

However, this conventional inner lead clamp device has a disadvantage that inner leads 5 can not be firmly clamped, because of using the inner lead clamp 7 shaped into an integrated type having a rectangular rim shaped pressing protrusion 10 adapted to press several inner leads 5 totally and the auxiliary clamp 11 adapted to press the inner lead clamp 7 so as to closely contact the inner leads 5 to the heat block 1.

That is, although the pressing protrusion 10 of the inner lead clamp 7 presses several inner leads 5 simultaneously, a part of inner leads 5 may not be closely in contact with the heat block 1, because a certain gap may be formed between inner leads 5 and the heat block 1, due to a possible deformation of inner leads 5 occurring in its machining and its transportation, an imprecise machining of and a poor maintenance of the heat block 1, a possible deformation of the inner lead clamp 7 occurring in its machining and assembling and a possible uneven pressing force applied to the inner lead clamp 7. As a result, the connection of wires 6 is unstable, thereby causing the reliability of semi-conductors to be decreased.

SUMMARY OF THE INVENTION

Therefore, an object of the invention is to overcome the above-mentioned disadvantages encountered in the prior art and to provide a clamping device for inner leads of a lead frame which is capable of firmly clamping inner leads to a heat block.

In one aspect, the present invention provides a clamping device for inner leads of a lead frame comprising: a clamp fixing plate having a working opening; and a plurality of inner lead clamps each made of a plate spring and fixedly mounted to an upper surface of said clamp fixing plate, each of said inner lead clamps having at a respective inner end thereof a vertical pressing portion extending downward into said working opening of the clamp fixing plate and for pressing a group of inner leads.

In another aspect, the present invention provides a clamping device for inner leads of a lead frame comprising: a clamp fixing plate having a working opening; and resilient clamp means mounted to said clamp fixing plate and adapted to clamp inner leads in groups or individually.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 3A:
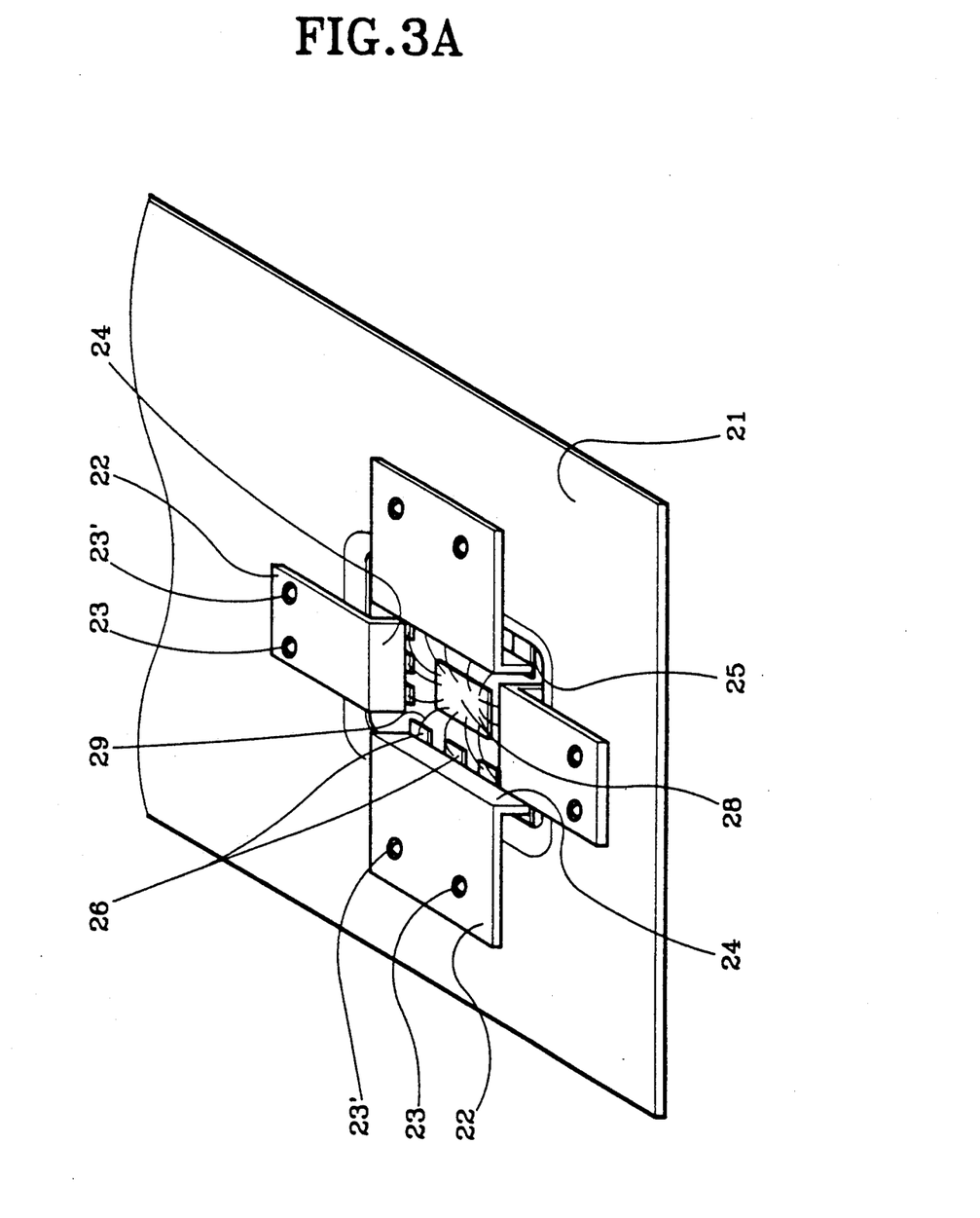
FIGS. 3A and 3B are perspective views of clamp devices having different constructions in accordance with the present invention, respectively.
Figure 3B:
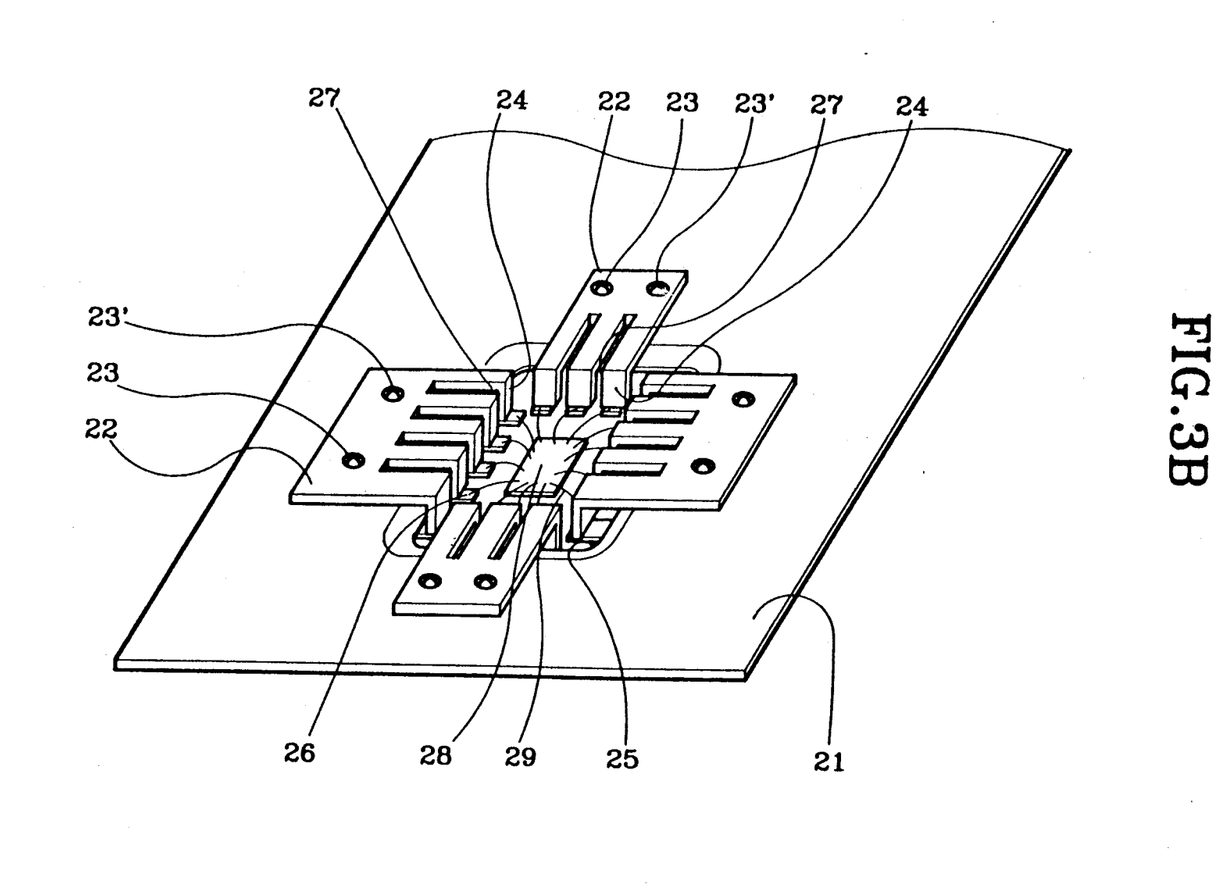
Figure 4:
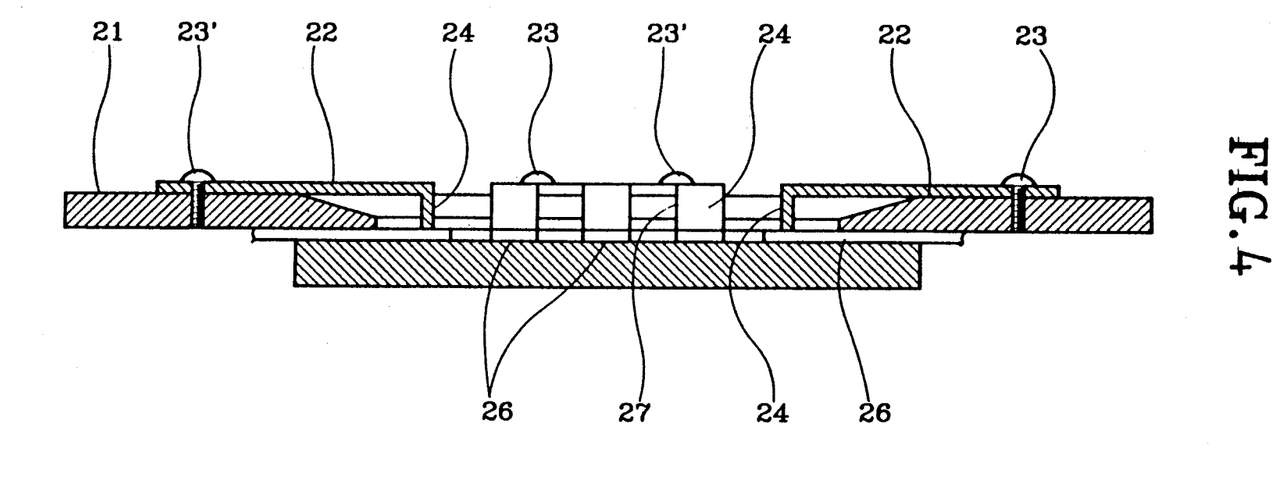
FIG. 4 is a cross-sectional view of the clamp device shown in FIG. 3B.

Referring to FIGS. 3A and 3B, there is shown a clamping device for inner leads in accordance with an embodiment of the present invention. Also, FIG. 4 is a cross-sectional view of the clamping device shown in FIG. 3B. As shown in the drawings, the clamping device comprises a clamp fixing plate 21 having a working opening 25 and a plurality of inner lead clamps 22 each made of a plate spring and fixedly mounted to the upper surface of said clamp fixing plate 21, by means of set screws 23 and 23'. Each inner lead clamp 22 has at the inner end thereof a vertically curved pressing portion 24 extending normal to the upper surface of clamp fixing plate 21 and downward into the working opening 25 of the clamp fixing plate 21. In the embodiment shown in the drawings, four inner lead clamps 22 are arranged at respective edges of the rectanglar working opening 25.

As shown in FIG. 3A, the pressing portion 24 of each inner lead clamp 22 functions to clamp a group of inner leads 26 totally, as shown in FIG. 3A. On the other hand, the pressing portion 24 may be divided into several feet corresponding to and individually clamping respective inner leads 26 of the inner lead group, by uniformly spaced cut-out portions 27, as shown in FIG. 3B.

In a wire bonding, the clamp fixing plate 21 of the construction according to the present invention is downwardly moved above a lead frame supported on a heat block so that the pressing portion 24 of inner lead clamps 22 can press tips of inner leads 26 in groups or individually. Thus, the inner leads 26 are more closely in contact with the heat block. Consequently, the wire bonding can be successfully accomplished by connecting the inner leads 26 and the semi-conductor chip 28, by means of wires 29, under the condition that the inner leads 26 have been more closely in contact with the heat block, as mentioned above.

Figure 5:
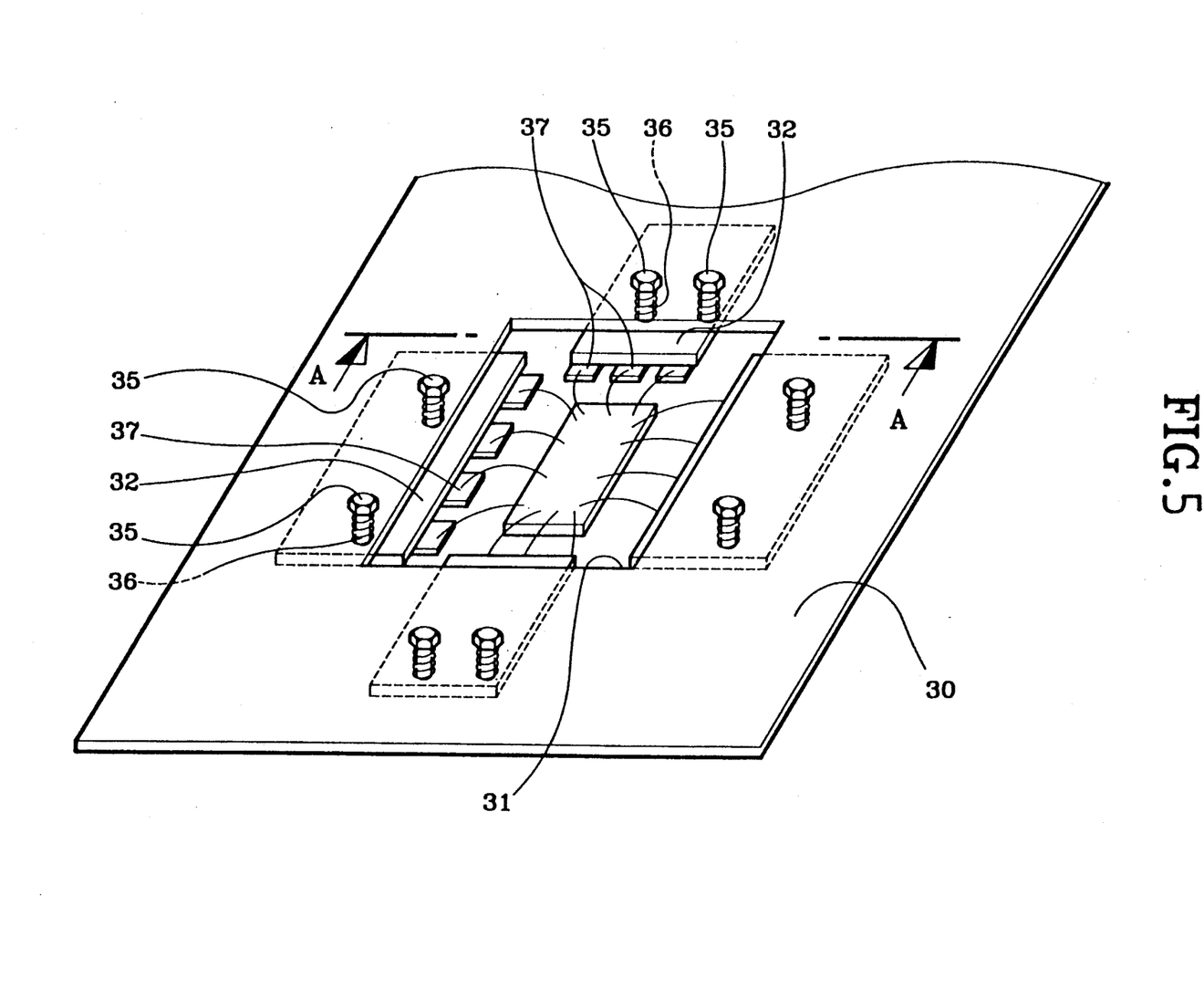
FIG. 5 is a perspective view of an inner lead clamping device in accordance with another embodiment of the present invention.
Figure 6:
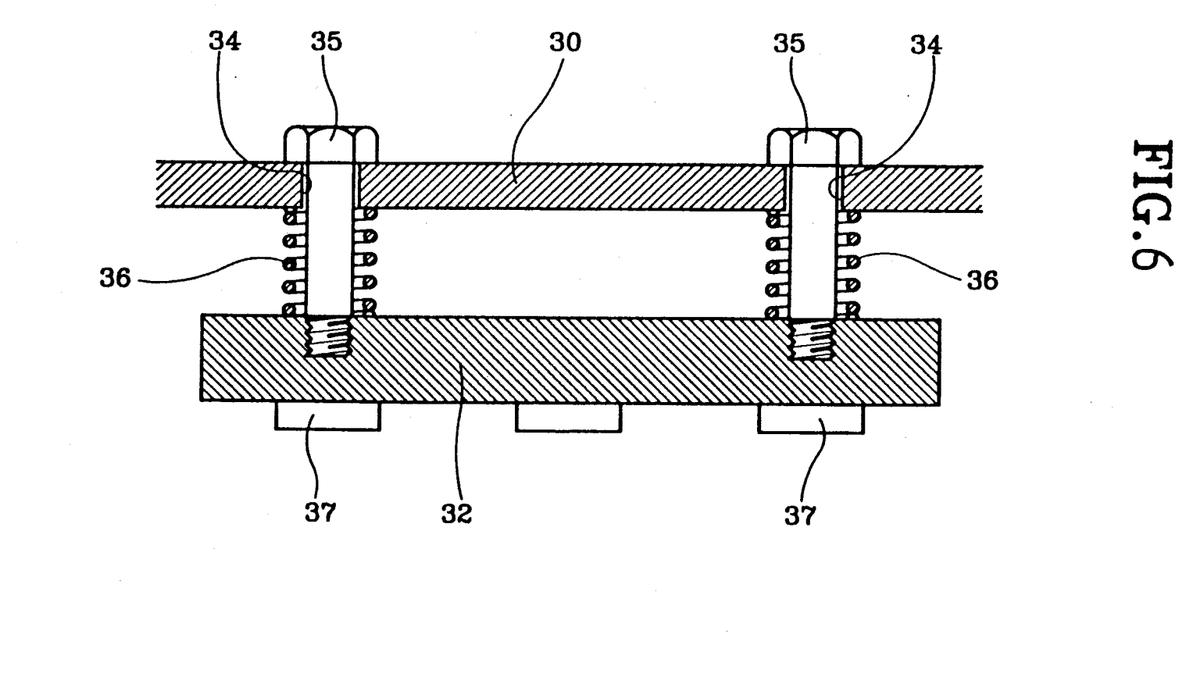
FIG. 6 is a cross-sectional view taken along the line A—A of FIG. 5.

On the other hand, FIG. 5 is a perspective view showing an inner lead clamping device in accordance with another embodiment of the present invention. Referring to FIG. 6, there is shown a cross-sectional view taken along the line A—A of FIG. 5. As shown in the drawings, the clamping device comprises a clamp fixing plate 30 having a working opening 31 and a plurality of inner lead clamps 32 arranged at peripheral edges of the working opening 31, respectively, and resiliently supported on the bottom surface of the clamp fixing plate 30, by means of compression coil springs 36. The compression springs 36 function to urge the inner lead clamps 32 away from the clamp fixing plate 30, that is downwardly. That is, the clamp fixing plate 30 has a plurality of spaced bolt holes 34 formed around the peripheral edges of the working opening 31. In each bolt hole 34, a bolt 35 is received, as shown in FIG. 6. In the embodiment shown in FIG. 5, two bolt holes 34 and two bolts 35 are provided at each edge of the working opening 31 to couple each inner lead clamp to said edge. Of course, the number of bolt holes 34 and bolts 35 may be varied. To the protruded ends of each bolt pair 35, each corresponding inner lead clamp 32 having a proper length is threadedly connected. Between the clamp fixing plate 30 and each inner lead clamp 32, each compression coil spring 36 is fitted around the corresponding bolt 35. By virtue of the resilient force of compression coil springs 36, each inner lead clamp 32 can clamp a group of inner leads 37 totally.

Figure 7:
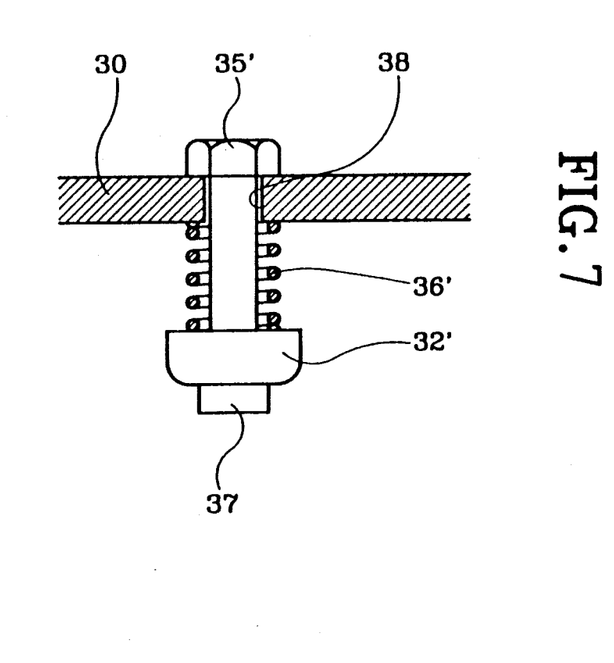
FIG. 7 is a cross-sectional view similar to FIG. 6, showing a deformed construction of the clamping device of FIG. 6.

Referring to FIG. 7, there is shown a clamping device in accordance with another embodiment of the present invention. In this embodiment, the clamp fixing plate 30 has a plurality of bolt holes 38 having the number corresponding to that of inner leads 37. In similar to the just previous embodiment, a bolt 35' is received in each bolt hole 38. To the protruded end of each bolt 35', an inner lead clamp 32' is threadedly connected. Between the clamp fixing plate 30 and each inner lead clamp 32, a compression coil spring 36' is fitted around the corresponding bolt 35'. By virtue of the resilient force of each compression coil spring 36', each corresponding inner lead clamp 32' can clamp the corresponding inner lead 37.

Figure 8:
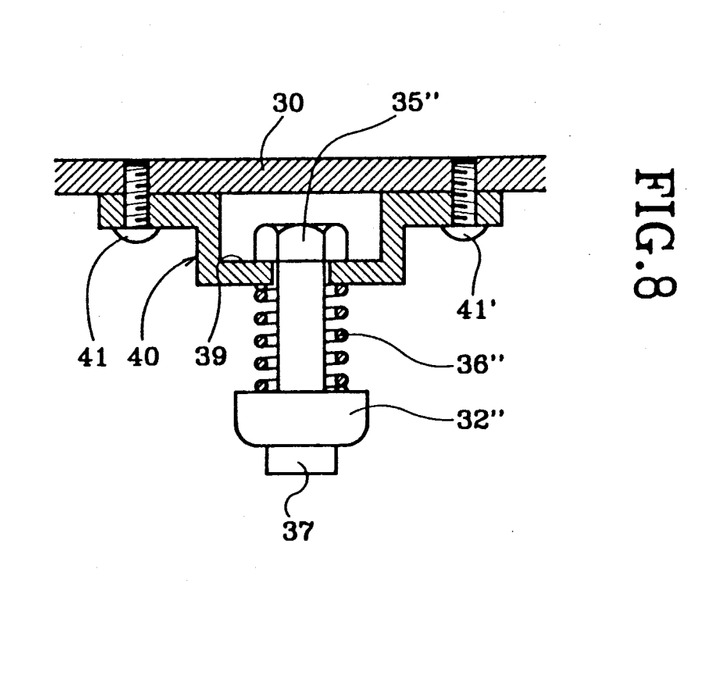
FIG. 8 is a cross-sectional view similar to FIG. 6, showing another deformed construction of the clamping device of FIG. 6.

FIG. 8 is a cross-sectional view showing still another embodiment adapted to clamp inner leads 37 individually. In this embodiment, the clamp fixing plate 30 has a plurality of guides 40 having the number corresponding to that of inner leads 37. Each guide 40 is fixedly mounted to the lower surface of the clamp fixing plate 30, by means of set screws 41 and 41', and provided with a recessed bolt mounting portion 39 receiving a bolt 35". In similar to the above-mentioned embodiment, an inner lead clamp 32" is threadedly connected to the end of each bolt 35" from the guide 40. Between each guide 40 and each corresponding inner lead clamp 32", a compression coil spring 36" is fitted around the corresponding bolt 35". With this construction, inner leads 37 can be individually clamped, under the condition that the head of each bolt 35" is not exposed by the clamp fixing plate 30.

Thus, it is possible to closely contact inner leads 37 of the lead frame to the heat block in groups or individually, by clamping tips of inner leads 37 by group-type inner lead clamps 32 or individual-type inner lead clamps 32' or 32" which are resiliently supported by compression coil springs 36, 36' 36" respectively.

As apparent from the above description, the present invention provides a clamping device which can clamp inner leads in groups or individually, so that inner leads are more closely in contact with the heat block. As a result, bonding of wires can be more firmly accomplished, thereby improving the reliability of semi-conductors.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A clamping device for clamping inner leads of a lead frame, comprising:
    a clamp fixing plate having a working opening; and
    a plurality of inner lead clamps each made of a plate spring and fixedly mounted to an upper surface of said clamp fixing plate, each of said inner lead clamps having at a respective inner end thereof a vertical pressing portion extending normal to said upper surface and downward into said working opening of the clamp fixing plate for pressing a group of inner leads.

2. A clamp device in according with claim 1, wherein:

said pressing portion of each inner lead clamp has a plurality of uniformly spaced cut-out portions so that said inner leads are clamped individually.

3. A clamping device for clamping inner leads of a lead frame, comprising:
   a clamp fixing plate having a working opening; and resilient clamp means mounted to said clamp fixing plate and adapted to clamp inner leads in groups or individually, wherein the resilient clamp means comprises
   a plurality of spaced bolt holes formed around the peripheral edges of the working opening;
   a plurality of bolts received in said bolt holes, respectively, and subdivided into several sets, each of said bolts having a protruded end,
   several inner lead clamps each corresponding to each bolt set and threadedly connected to said protruded ends of the bolt set, and
   a plurality of compression coil springs each fitted around each bolt between the clamp fixing plate and each corresponding inner lead clamp and adapted to urge the corresponding inner lead clamp away from the clamp fixing plate so that said inner lead clamps can clamp inner leads in groups, by virtue of the resilient force of said compression coil springs.

4. A clamping device for clamping inner leads of a lead frame, comprising:
   a clamp fixing plate having a working opening;
   resilient clamp means mounted to said clamp fixing plate and adapted to clamp inner leads in groups or individually;
   a plurality of bolts respectively received in said bolt holes, each of said bolts having a protruded end;
   a plurality of inner lead clamps each threadedly connected to said protruded end of each corresponding bolt; and
   a plurality of compression coil springs each fitted around each bolt between the clamp fixing plate and each corresponding inner lead clamp and adapted to urge the corresponding inner lead clamp away from the clamp fixing plate so that said inner lead clamps can clamp inner leads individually by virtue of the resilient force of said compression coil springs.

5. A clamping device for clamping inner leads of a lead frame, comprising:
   a clamp fixing plate having a working opening;
   resilient clamp means mounted to said clamp fixing plate and adapted to clamp inner leads in groups or individually;
   a plurality of guides having the number corresponding to that of inner leads and fixedly mounted to the lower surface of the clamp fixing plate, each of said guide having a recessed bolt mounting portion;
   a plurality of bolts received in said bolt mounting portions of guides, respectively, each of said bolts having a protruded end;
   a plurality of inner lead clamps each threadedly connected to said protruded end of each corresponding bolt; and
   a plurality of compression coil springs each fitted around each bolt between the clamp fixing plate and each corresponding inner lead clamp and adapted to urge the corresponding inner lead clamp away from the clamp fixing plate so that said inner lead clamps can clamp inner leads individually, by virtue of the resilient force of compression coil springs.

* * * * *